(12) United States Patent
Tsunetou

(10) Patent No.: US 7,881,131 B2
(45) Date of Patent: Feb. 1, 2011

(54) SEMICONDUCTOR DEVICE, INFORMATION CONTROL METHOD AND ELECTRONIC DEVICE

(75) Inventor: Kouji Tsunetou, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 213 days.

(21) Appl. No.: 12/340,083

(22) Filed: Dec. 19, 2008

(65) Prior Publication Data

US 2009/0168562 A1 Jul. 2, 2009

(30) Foreign Application Priority Data

Dec. 26, 2007 (JP) .............................. 2007-333463

(51) Int. Cl.
*G11C 7/00* (2006.01)
(52) U.S. Cl. .............................. 365/189.16; 365/225.7; 365/185.04
(58) Field of Classification Search ............ 365/189.16, 365/225.7, 185.04, 230.03
See application file for complete search history.

(56) References Cited

U.S. PATENT DOCUMENTS

2007/0136542 A1* 6/2007 Rudelic ...................... 711/163
2009/0196109 A1* 8/2009 Walker .................. 365/189.07

FOREIGN PATENT DOCUMENTS

JP 2004-245060 A 9/2004

* cited by examiner

*Primary Examiner*—Vu A Le
*Assistant Examiner*—Han Yang
(74) *Attorney, Agent, or Firm*—Arent Fox LLP

(57) ABSTRACT

A semiconductor device includes a first memory unit, a second memory unit, and a determination unit receiving a first signal permitting a write operation to one of the first memory unit and the second memory unit, and a second signal indicating whether the write operation of information to the first memory unit is finished, wherein the determination unit outputs a signal prohibiting a write operation to the second memory unit, if the second signal indicates the write operation of the information is finished.

10 Claims, 6 Drawing Sheets

FIG. 2

| Mode | Input | | Output |
|---|---|---|---|
| | WE | SENSE | FO |
| Read | L | H | [valid] |
| Sleep | L | L | H |
| Write | H | L | H |

SEMICONDUCTOR DEVICE, INFORMATION CONTROL METHOD AND ELECTRONIC DEVICE

CROSS-REFERENCE TO RELATED APPLICATIONS

This application claims the benefit of priority of Japanese Patent Application No. 2007-333463 filed on Dec. 26, 2007, the entire contents of which are incorporated herein by reference.

BACKGROUND

1. Field

The present application relates to a semiconductor device, an information control method and an electronic device.

2. Description of the Related Art

In terms of ensuring security of hardware or software, greater tamper-proof capability is desired, so as to prevent the inside of the hardware or the software from being analyzed or falsified. In the field of semiconductor devices, the prevention of unauthorized write operations carried out on a semiconductor device by unauthorized persons is necessary. For example, unauthorized write operations by unauthorized persons may be prevented by controlling a switching operation between a mode, in which information is written to the semiconductor device, and the other mode, in which the written information to perform a desired operation is read from the semiconductor device.

Japanese Laid-open Patent Publication No. 2004-245060 discusses that one or more non-disclosed connector terminals is/are added separate from disclosed connector terminals used for inputting write enable/disable signals to a rewritable non-volatile memory.

Since a semiconductor device enters a write mode only when all the signals are correctly input to both the disclosed and non-disclosed connector terminals in the typical technique discussed above, a write operation to the rewritable non-volatile memory is not executed in the above case.

In the typical technique, a control signal is input to the non-disclosed connector terminal(s) for controlling a write operation to the semiconductor device.

Consequently, if the non-disclosed connector terminal(s) is/are detected by an unauthorized person, the control signal is input thereto, so that an unauthorized write operation to the semiconductor device may be carried out. Hence, the typical technique is unable to prevent the unauthorized write operation by the unauthorized person, in the above case.

SUMMARY

According to aspects of an embodiment(s), a semiconductor device includes a first memory unit, a second memory unit, and a determination unit receiving a first signal permitting a write operation to one of the first memory unit and the second memory unit, and a second signal indicating whether the write operation of information to the first memory unit is finished, wherein the determination unit outputs a signal prohibiting a write operation to the second memory unit, if the second signal indicates the write operation of the information is finished.

BRIEF DESCRIPTION OF THE DRAWINGS

FIG. 2 illustrates aspects of a function of the 1-bit E-Fuse in FIG. 1;

DETAILED DESCRIPTION OF THE EMBODIMENTS

Aspects of an embodiment relate to a semiconductor device, an information control method and an electronic device that require protection against unauthorized alteration by an unauthorized person.

Aspects including 1-bit E-Fuses are disclosed with reference to drawings. The 1-bit E-Fuse is a memory block that stores one-bit of information.

Figure 1:
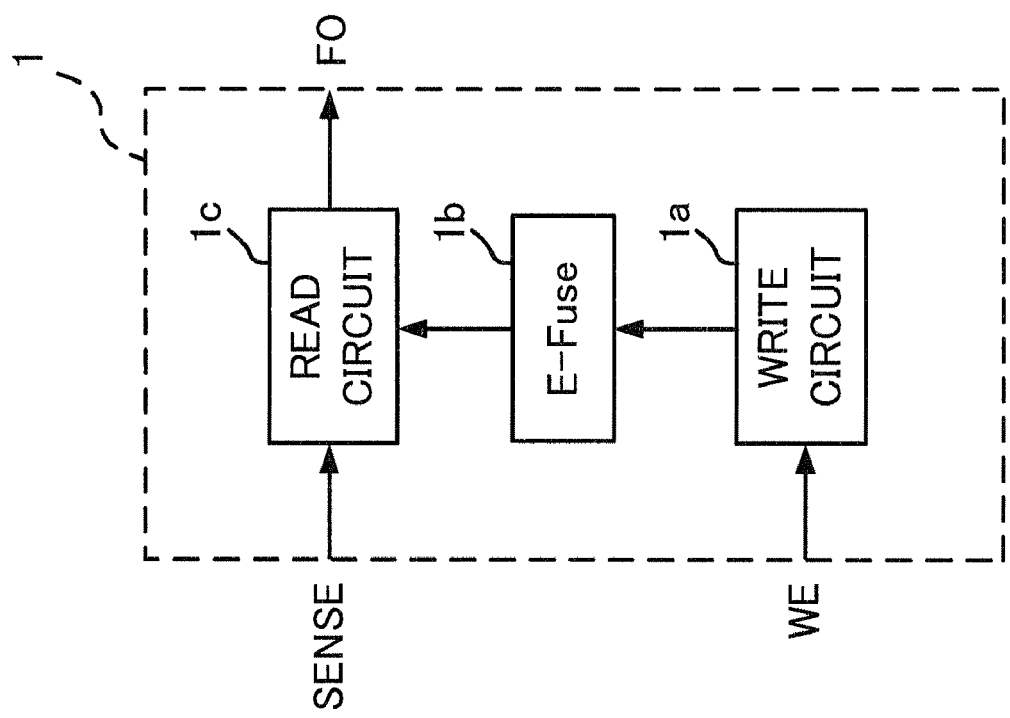
FIG. 1 illustrates aspects of an exemplary configuration of a 1-bit E-Fuse associated with various embodiments.

FIG. 1 illustrates an exemplary configuration of the 1-bit E-Fuse associated with various embodiments. The 1-bit E-Fuse includes a write circuit 1a, an E-Fuse element 1b, and a read circuit 1c.

As shown in FIG. 1, the E-Fuse element 1b in FIG. 1 may be, for example, a memory element in which a piece of information is written only once and in one direction. The description "written in one direction" is an irreversible write operation where a rewrite operation from one logic level to the other logic level may be possible, and on the other hand, a write operation in the reverse direction may be impossible. For example, the E-Fuse element 1b may store the piece of information by defining states before and after disconnection/uncoupling of a fuse. When the fuse is disconnected/uncoupled by current supplied to a conductive wire and burns out the fuse, a state before the disconnection of the fuse is defined as an L level and a state after the disconnection of the fuse is defined as an H level (and vice versa).

As further shown in FIG. 1, the write circuit 1a disconnects/uncouples the E-Fuse element 1b. In other words, the piece of information is written to the E-Fuse element 1b in response to a write signal WE. The read circuit 1c reads data of the E-Fuse element 1b in response to a read control signal SENSE and outputs a fuse data output signal FO.

FIG. 2 illustrates a function of the 1-Bit E-Fuse in FIG. 1.

As shown in FIG. 2, the 1-Bit E-Fuse 1 in FIG. 1 may have, for example, three modes such as a read mode, a sleep mode, and a write mode. A read operation is performed in the read mode. The 1-Bit E-Fuse 1 enters a quiescent state in the sleep mode. A write operation is performed in the write mode. As disclosed in FIG. 1, the 1-bit E-Fuse 1 in FIG. 1 includes two kinds of input signals (Input) and one kind of output signal (Output). The above two kinds of input signals are the write signal WE and the read control signal SENSE. The above one kind of output signal is the fuse data output signal FO.

As further shown in FIG. 2, for example, the 1-bit E-Fuse 1 in FIG. 1 may go to the read mode in response to the write signal WE at an L level and the read control signal SENSE at an H level.

The fuse data output signal FO is valid. That is to say, data of the E-Fuse element 1b in FIG. 1, read by the read circuit 1c in FIG. 1, is output in the read mode. For example, the data of the E-Fuse element 1b in FIG. 1 may be defined in the following manner. The data before the disconnection/uncoupling is defined as an L level. The data after the disconnection/uncoupling is defined as an H level.

As further shown in FIG. 2, for example, the 1-bit E-Fuse 1 in FIG. 1 may go to the sleep mode in response to the write signal WE at the L level and the read control signal SENSE at an L level. The fuse data output signal FO is fixed at an H level in the sleep mode.

As further shown in FIG. 2, for example, the 1-bit E-Fuse 1 in FIG. 1 may go to the write mode in response to the write signal WE at an H level and the read control signal SENSE at the L level. The fuse data output signal FO is fixed at the H level in the write mode.

If both the write signal WE and the read control signal SENSE are the H level, inputs thereof are prohibited. If both the write signal WE and the read control signal SENSE are the H level, the fuse data output signal FO is defined as the H level.

The function of the 1-bit E-Fuse 1 in FIG. 1 disclosed with reference to FIG. 2 is merely one example. It is merely one example that the data of the E-Fuse element 1b in FIG. 1 before the disconnection/uncoupling is defined as the L level and the data after the disconnection/uncoupling is defined as the H level. Although descriptions disclosed in the following embodiments are made with reference to FIG. 2, the embodiments disclosed below are not limited to the descriptions of FIG. 2.

Figure 3:
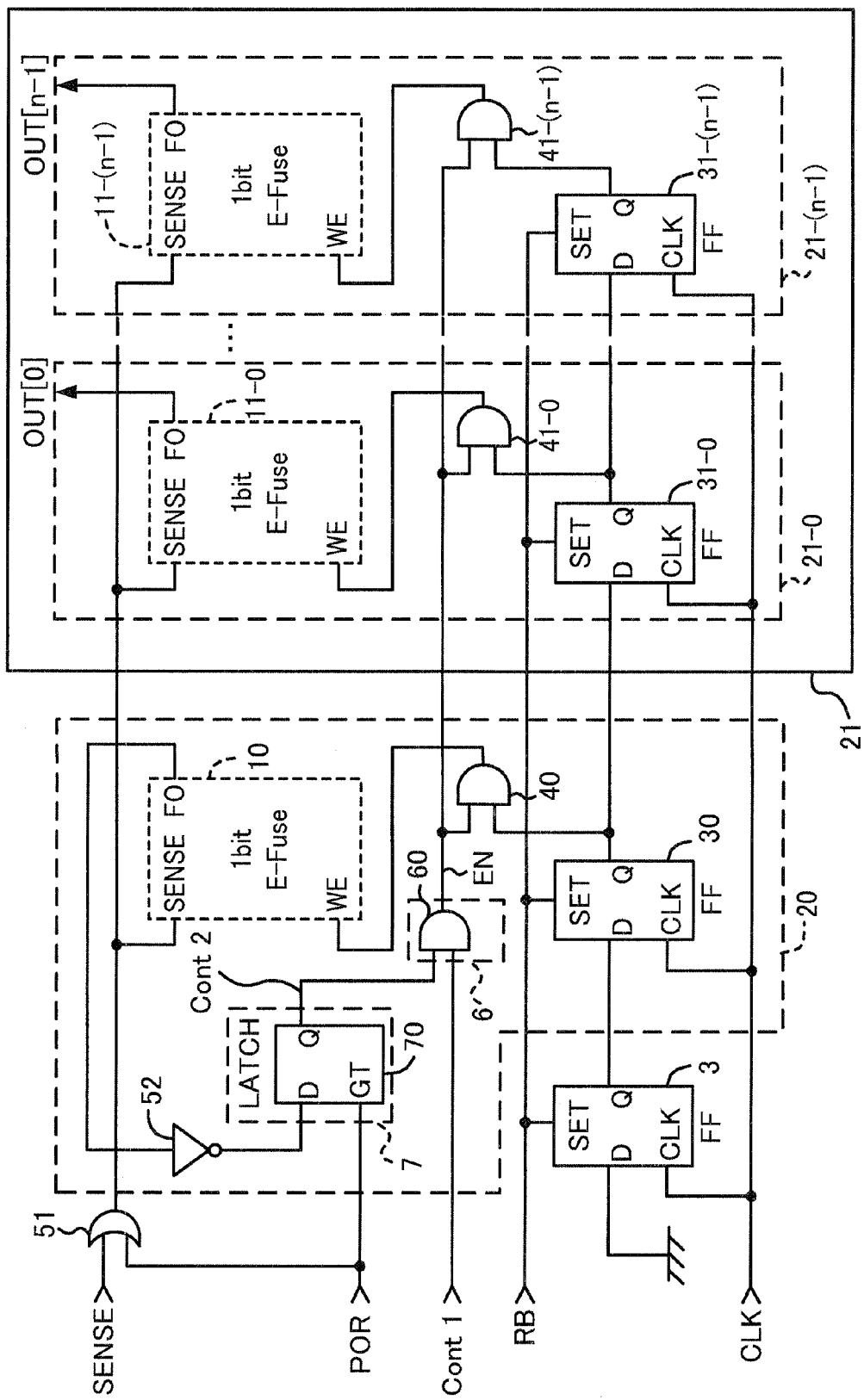
FIG. 3 illustrates aspects of a first embodiment.

FIG. 3 illustrates aspects of a first embodiment. A first memory unit 20 includes a 1-bit E-Fuse 10.

As shown in FIG. 3, an output of an AND gate 40 is input to a write signal WE terminal of the 1-bit E-fuse 10. An output (Q) of a flip-flop (hereinafter, referred to as an "FF") 30 and an output signal EN of a determination unit 6 are input to the AND gate 40. A reset signal RB is input to a clear terminal (CLR) of the FF 30. A clock signal CLK is input to a clock terminal (CLK) of the FF 30. A data terminal (D) of the FF 30 is coupled to an output (Q) of an FF 3 provided in a preceding stage. The reset signal RB is input to the clear terminal (CLR) of the FF 3. The clock signal CLK is input to the clock terminal (CLK) of the FF3. A data terminal (D) of the FF 3 is coupled to a ground.

As further shown in FIG. 3, the determination unit 6 includes an AND gate 60. In the first embodiment, the output signal EN of the determination unit 6 is an AND signal output from the AND gate 60. A first signal Cont1 and a second signal Cont2, output from a holding unit 7, are input to the AND gate 60. The holding unit 7 includes a latch 70. In the first embodiment, the second signal Cont2 is an output (Q) of the latch 70. The second signal Cont2 is held by the latch 70 at a voltage level, which is logically determined by a logic circuit. A data terminal (D) of the latch 70 is coupled to an output of an inverter 52. A power-on reset signal POR is input to a GT terminal of the latch 70. A fuse data output signal FO of the 1-bit E-Fuse 10 is input to the inverter 52.

As further shown in FIG. 3, an output of an OR gate 51 is input to a read control signal SENSE terminal of the 1-bit E-Fuse 10.

The power-on reset signal POR and a read control signal SENSE are input to the OR gate 51. The power-on reset signal POR is a signal that performs an initialization operation upon turning ON power.

As further shown in FIG. 3, a second memory unit 21 includes bit-information memory units 21-0 to 21-(n−1) on a bit-by-bit basis.

The bit information memory units 21-0 to 21-(n−1) include 1 bit E-Fuses 11-0 to 11-(n−1).

As further shown in FIG. 3, outputs of AND gates 41-0 to 41-(n−1) are input to the write signal WE terminals of the 1-bit E-Fuses 11-0 to 11-(n−1). Outputs (Q) of FFs 31-0 to 31-(n−1) and the output signal EN of the determination unit 6 are input to the AND gates 41-0 to 41-(n−1). In the FFs 31-0 to 31-(n−1), the reset signal RB is input to clear terminals (CLR) and the clock signal CLK is input to clock terminals (CLK), respectively. Data terminals (D) of the FFs 31-0 to 31-(n−1) are coupled to outputs (Q) of the FFs provided in the preceding stages.

As further shown in FIG. 3, an output of the OR gate 51 is input to read control signal SENSE terminals of the 1-bit E-Fuses 11-0 to 11-(n−1). Output signals OUT [0] to OUT [n−1] of the bit information memory units 21-0 to 21-(n−1) are fuse data output signals FO of the 1-bit E-Fuses 11-0 to 11-(n−1).

Hereinafter, an operation of the first embodiment in FIG. 3 will be disclosed. As further shown in FIG. 3, upon turning ON the power, the power-on reset signal POR rises. The read control signal SENSE input via the OR gate 51 to the 1-bit E-Fuse 10 goes to an H level. The 1-bit E-Fuse 10 goes to a read mode. Data of an E-fuse element provided in the 1-bit E-Fuse 10 is read and the fuse data output signal FO is output. The fuse data output signal FO is logically inverted by the inverter 52. In response to the rise in the power-on reset signal POR, the latch 70 holds the inverted logic of the fuse data output signal FO. The second signal Cont2 whose logic is held is output by the latch 70.

As further shown in FIG. 3, since the FFs are initialized in response to the reset signal RB going to an H level, the output of the FF3 goes to an H level and the outputs (Q) output from the FF 30 and the FFs 31-0 to 31-(n−1) go to an L level. The FF 3, the FF 30, the FFs 31-0 to 31-(n−1) share the same clock signal CLK and couple the data terminals (D) and the outputs (Q). Consequently, upon a release from a reset in response to the reset signal RB going to an L level from the H level, the H level of the output (a) of the FF 3 transfers to the FFs in the following stages, like a shift register, on a clock-by-clock basis.

As further shown in FIG. 3, when the H level is transferred to the FF coupled to a 1-bit E-Fuse, to which a piece of information is written (that is to say, a 1-bit E-Fuse whose E-Fuse element provided therein is disconnected/uncoupled), the output signal EN of the determination unit 6 (that is to say, the AND signal of the AND gate 60) goes to an H level, so that the write signal WE to the above-described 1-bit E-Fuse goes to an H level through the AND gate 40 and the AND gates 40-1 to 40-(n−1). The above-described 1-bit E-Fuse goes to a write mode and the E-Fuse element provided in the above-described 1-bit E-Fuse is disconnected/uncoupled.

As further shown in FIG. 3, the fuse data output signal FO is an L level before an E-Fuse element of a 1-bit E-Fuse 10 in the first memory unit 20 is disconnected/uncoupled. Consequently, the second signal Cont2 is held at an H level and output, by the latch 70. Hence, the AND signal output from the AND gate 60 becomes a signal having the same phase as that of the first signal Cont1.

As further shown in FIG. 3, the fuse data output signal FO is an H level once an E-Fuse element of a 1-bit E-Fuse 10 in the first memory unit 20 has been disconnected/uncoupled. Consequently, the second signal Cont2 is held at an L level and output, by the latch 70. Hence, the first signal Cont1 is masked. The AND signal of the AND gate 60 is fixed at an L level.

As disclosed above, a write operation to the first memory unit 20 or to the second memory unit 21 is permitted with the first signal Cont1 before the E-Fuse element of the 1-bit E-Fuse 10 provided in the first memory unit 20 is disconnected/uncoupled. On the other hand, once the E-Fuse element of the 1-bit E-Fuse 10 in the first memory unit 20 has been disconnected/uncoupled, the first signal Cont1 is masked, so that the AND signal of the AND gate 60 is fixed at the L level. Because of this, a write operation to the second memory unit 21 is prohibited with the output signal EN of the determination unit 6. The second signal Cont2 indicates whether the E-Fuse element of the 1-bit E-Fuse 10 in the first memory unit 20 is disconnected/uncoupled or not. In the first embodiment in FIG. 3, a state of the write operation performed on the 1-bit E-Fuse 10 in the first memory unit 20 is indicated with the second signal Cont2, indicating whether the write operation is finished or not. Subsequent write operations to the second memory unit 21 are prohibited with the output signal En of the determination unit 6 by writing the piece of information to the 1-bit E-Fuse 10 in the first memory unit 20.

In the first embodiment in FIG. 3, upon turning ON the power, the data of the E-Fuse element in the 1-bit E-Fuse 10 is read with the power-on reset signal POR. Consequently, if the piece of information has already been written to the 1-bit E-Fuse 10 in the first memory unit 20, an unauthorized write operation by an unauthorized person is prevented. Note that if each of the 1-bit E-Fuses is in the write mode, any of the E-Fuse elements in the 1-bit E-Fuses 10, 11-0 and 11-(n−1) is disconnected/uncoupled. In other words, if the read control signal SENSE of each of the 1-bit E-Fuses is an L level, the any of the E-Fuse elements in the 1-bit E-Fuses 10, 11-0 and 11-(n−1) is disconnected/uncoupled. In the above case, the fuse data output signal FO goes to the H level even though the piece of information has not been written to the 1-bit E-Fuse 10 in the first memory unit 20 (see FIG. 2). The above result may create a presumption that the write operation thereto is prohibited.

However, since the second signal Cont2 upon turning ON the power is held by the latch 70, the output signal EN of the determination unit 6 does not prohibit the write operation to the second memory unit 21. If the piece of information has not been written to the 1-bit E-Fuse 10 in the first memory unit 20, the any of the E-Fuse elements of the 1-bit E-Fuses 10, 11-0 and 11-(n−1) is disconnected/uncoupled.

In the first embodiment in FIG. 3, both a read operation performed on the first memory unit 20 and a read operation performed on the second memory unit 21 are controlled with the read control signal SENSE.

Figure 4:
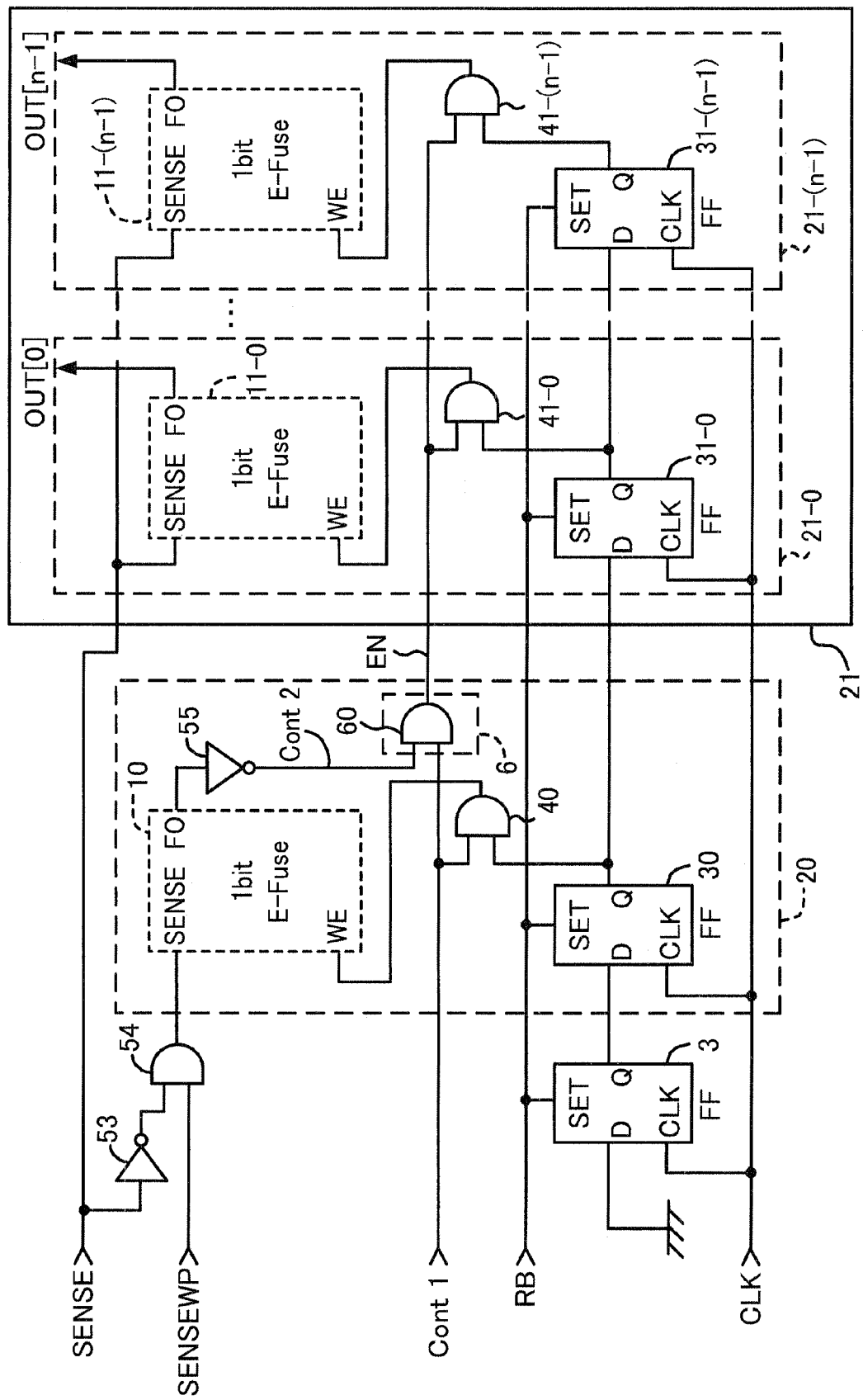
FIG. 4 illustrates aspects of a second embodiment.

FIG. 4 illustrates aspects of a second embodiment. A first memory unit 20 includes a 1-bit E-Fuse 10.

As shown in FIG. 4, an output of an AND gate 40 is input to a write signal WE terminal of the 1-bit E-Fuse 10. An output (Q) of an FF 30 and a first signal Cont1 are input to the AND gate 40. A coupling of the FF 30 and a coupling of an FF 3 in the second embodiment are the same as those in the first embodiment in FIG. 3 and the descriptions thereof will be reduced or omitted.

As further shown in FIG. 4, an output of an AND gate 54 is input to a read control signal SENSE terminal of the 1-bit E-Fuse 10.

A write-protect read control signal SENSEWP and a read control signal SENSE whose logic is inverted by an inverter 53 are input to the AND gate 54.

As further shown in FIG. 4, a determination unit 6 includes an AND gate 60. An output signal EN of the determination unit 6 in the second embodiment is an AND signal output by the AND gate 60. The first signal Cont1 and a second signal Cont2, output from an inverter 55, are input to the AND gate 60. A fuse data output signal FO of the 1-bit E-Fuse 10 is input to the inverter 55. The second signal Cont2 in the second embodiment is the fuse data output signal FO of the 1-bit E-Fuse 10. Note that the above fuse data output signal is logically inverted by the inverter 55.

A structure of a second memory unit 21 in FIG. 4 according to the second embodiment is the same as that of the second memory unit 21 in FIG. 3 according to the first embodiment and the description thereof will be reduced or omitted.

An operation of the second embodiment in FIG. 4 will be disclosed. Operations of the FF3, the FF30, and FFs 31-0 to 31-(n−1) are the same as those of the first embodiment in FIG. 3 and the descriptions thereof will be reduced or omitted.

The second embodiment in FIG. 4 includes the write-protect read control signal SENSEWP in addition to the read control signal SENSE. A read operation performed on the first memory unit 20 and a read operation performed on the second memory unit 21 are separately controlled.

As further shown in FIG. 4, the fuse data output signal FO is defined as an H level if the 1-bit E-Fuse 10 provided in the first memory unit 20 is not in a read mode but in the different modes (see FIG. 2). If the fuse data output signal FO is the H level, the second signal Cont2 goes to an L level by the inverter 55. Since the second signal Cont2 is the L level, the AND signal of the AND gate 60 is fixed at an L level. That is to say, the first signal Cont1 is masked. In consequence, the output signal EN of the determination unit 6 prohibits a write operation to the second memory unit 21. If the 1-bit E-Fuse 10 in the first memory unit 20 is in a read mode and data of an E-Fuse element therein is read, the write operation to the second memory unit 21 is performed. In other words, the read control signal SENSE terminal of the 1-bit E-Fuse 10 provided in the first memory unit 20 is defined as an H level in the read mode. On the other hand, read control signal SENSE terminals of 1-bit E-Fuses 11-0 to 11-(n−1) in the second memory unit 21 are defined as an L level in a write mode.

As further shown in FIG. 4, if the read control signal SENSE is an L level and the write-protect read control signal SENSEWP is an H level, the read control signal SENSE terminal of the 1-bit E-Fuse 10 provided in the first memory unit 20 goes to the H level by the inverter 53 and the AND gate 54. On the other hand, the read control signal SENSE terminals of the 1-bit E-Fuses 11-0 to 11-(n−1) in the second memory unit 21 go to the L level. In consequence, the write operation to the second memory unit 21 is performed.

As further shown in FIG. 4, the write-protect read control signal SENSEWP and the read control signal SENSE are combined, in the second embodiment. In consequence, for example, use of a power-on reset signal POR may not be necessary, in the second embodiment. In other words, a state of a write operation performed on the 1-bit E-Fuse 10 in the first memory unit 20 is indicated with the second signal Cont2, indicating whether or not the write operation is finished, in the second embodiment. Subsequent write operations to the second memory unit 21 are prohibited with the output signal EN of the determination unit 6 by writing a piece of information to the 1-bit E-Fuse 10 in the first memory unit 20.

In the second embodiment, data of the E-Fuse element in the 1-bit E-Fuse 10 in the first memory unit 20 is read for performing the write operation to the second memory unit 21. If the piece information has been written to the 1-bit E-Fuse 10 provided in the first memory unit 20, an unauthorized write operation by an unauthorized person may be prevented.

As further shown in FIG. 4, if the read control signal SENSE is an H level, the read control signal SENSE terminal input to the 1-bit E-Fuse 10 in the first memory unit 20 goes to an L level and the read control signal SENSE terminals input to the 1-bit E-Fuses 11-0 to 11-(n−1) in the second memory unit 21 go to an H level, regardless of logic levels of the write-protect read control signal SENSEWP. In consequence, the read operation to the second memory unit 21 is performed.

As further shown in FIG. 4, if the read control signal SENSE is the L level and write-protect read control signal SENSEWP is an L level, both the read control signal SNSE terminal input to the 1-bit E-Fuse 10 provided in the second memory unit 20 and the read control signal SNSE terminals input to the 1-bit E-Fuses 11-0 to 11-(n−1) provided in the second memory unit 21 go to an L level.

In the above case, an entire semiconductor device that includes the first memory unit 20 and the second memory unit 21 enters a sleep mode.

As further shown in FIG. 4, if the write operation to the first memory unit 20 is performed, the 1-bit E-Fuse 10 is switched to the write mode. If the 1-bit E-Fuse 10 is in the read mode, the write operation to the second memory unit 21 is performed, so that write-protection is performed on the second memory unit 21 in the above-described case.

As further shown in FIG. 4, the write-prohibition with the output signal EN of the determination unit 6 may not be necessary in the 1-bit E-Fuse 10 provided in the first memory unit 20, in the second embodiment. For example, the E-Fuse element of the 1-bit E-Fuse 10 may be a memory element having a function in which a piece of information is capable of being written only once and in one direction. Consequently, the write-protection is performed on the second memory unit 21 once the information is written to the 1-bit E-Fuse 10.

As further shown in FIG. 4, the read operation to the first memory unit 20 and the read operation to the second memory unit 21 are separately controlled, in the second embodiment. Generally, power consumption in the read mode is caused by a direct current that is induced to flow. Since the 1-bit E-Fuse 10 provided in the first memory unit 20 does not enter the read mode except for a period in which the write operation is performed on the second memory unit 21, the power consumption may be suppressed.

Figure 5:
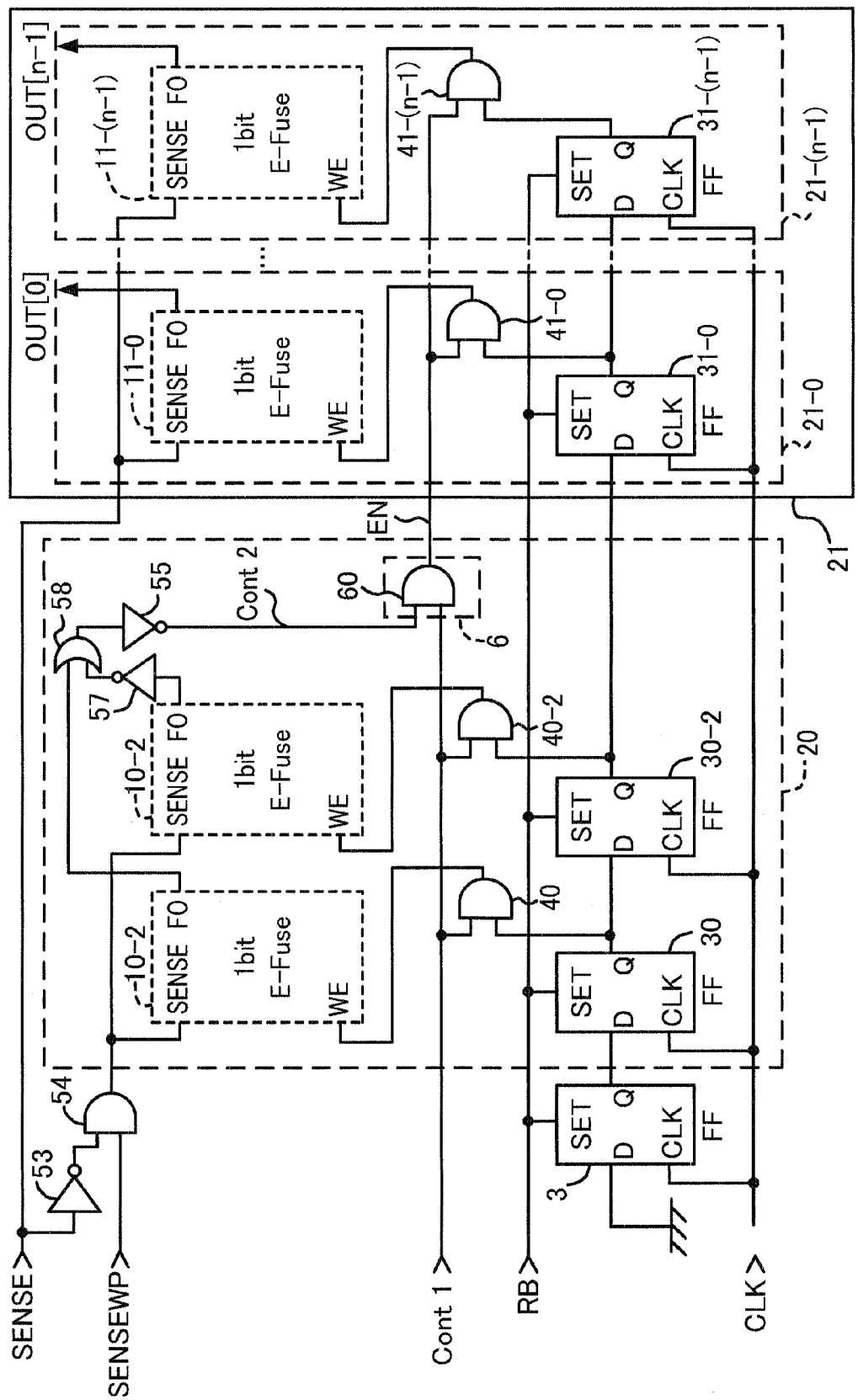
FIG. 5 illustrates aspects of a modified example of the second embodiment.

FIG. 5 illustrates a modified example of the second embodiment in FIG. 4. In comparison with the second embodiment in FIG. 4, a first memory unit 20 in which a countermeasure against a low voltage is added to the second embodiment in FIG. 4, further includes a 1-bit E-Fuse 10-2, an FF 30-2, an AND gate 40-2, an inverter 57 and an OR gate 58, in the modified example in FIG. 5.

As shown in FIG. 5, a fuse data output signal FO of a 1-bit E-Fuse 10 and a fuse data output signal FO of the 1-bit E-Fuse 10-2 are input to the OR gate 58. The fuse data output signal FO of the 1-bit E-Fuse 10-2 is logically inverted by the inverter 57. In the modified example in FIG. 5 according to the second embodiment, a second signal Cont2 is a signal that is obtained by logically inverting an OR signal output from the OR gate 58, with use of an inverter 55. A read control signal SENSE terminal and a write signal WE terminal of the 1-bit E-Fuse 10-2, the FF 30-2 and the AND gate 40-2 are coupled in the same manner as a read control signal SENSE terminal and a write signal WE terminal of the 1-bit E-Fuse 10, an FF 30 and an AND gate 40, respectively. A second memory unit 21 and other structural elements are the same as those of the second embodiment in FIG. 4 and the descriptions thereof will be reduced or omitted.

An operation of the modified example of the second embodiment in FIG. 5 will be disclosed. Operations of the FF3, an FF30, the FF 30-2, and FFs 31-0 to 31-(n−1) are the same as those of the second embodiment in FIG. 4 and the descriptions thereof will be reduced or omitted. An operation based upon a combination of a read control signal SENSE and a write-protect read control signal SENSEWP is the same as that of the second embodiment in FIG. 4 and the description thereof will be reduced or omitted.

As shown in FIG. 5, an E-Fuse element of a 1-bit E-Fuse 10-2 provided in a first memory unit 20 is disconnected/uncoupled in the modified example in FIG. 5 according to the second embodiment. As disclosed in the second embodiment in FIG. 4, a write operation that is performed on the 1-bit E-Fuse 10 in the first memory unit 20 with use of an output signal EN of a determination unit 6 is not prohibited.

A write operation performed on the 1-bit E-Fuse 10-2 is not prohibited in the same way. In consequence, the E-Fuse element in the 1-bit E-Fuse 10-2 is disconnected/uncoupled.

As further shown in FIG. 5, the fuse data output signal FO goes to an H level in response to the E-Fuse element in the 1-bit E-Fuse 10-2 being disconnected/uncoupled. In the above case, an output of the inverter 57 goes to an L level. If an E-Fuse element of the 1-bit E-Fuse 10 has not yet been disconnected/uncoupled, the OR signal output from the OR gate 58 is an L level. In the above case, the second signal Cont2 is an H level owing to the inverter 55.

Consequently, an AND signal output from an AND gate 60 becomes a signal having the same phase as that of a first signal Cont1. For the above reason, before the E-Fuse element of the 1-bit E-Fuse 10 in the first memory unit 20 is disconnected/uncoupled, the write operation to the first memory unit 20 or to the second memory unit 21 is permitted with the first signal Cont1.

As further shown in FIG. 5, the E-Fuse element of the 1-bit E-Fuse 10 in the first memory unit 20 is disconnected/uncoupled upon completion of a write operation performed on the second memory unit 21. In the above case, the OR signal output from the OR gate 58 goes to an H level. The second signal Cont2 goes to an L level by the inverter 55. Since the first signal Cont1 is masked, the AND signal output from the AND gate 60 is fixed at an L level. In consequence, the output signal EN of the determination unit 6 prohibits the write operation to the second memory unit 21.

As disclosed above, the modified example of FIG. 5 in the second embodiment has the same advantages as those in FIG. 4 according to the second embodiment. Hereinafter, an operation of the countermeasure against the low voltage that is taken by the modified example in FIG. 5 according to the second embodiment will be disclosed.

As further shown in FIG. 5, logic circuits peripheral to the respective 1-bit E-Fuses may operate even in the low voltage where a power supply voltage does not satisfy a predetermined operation condition. However, this may result in the fuse data output signal FO with erroneous logic level being output. For example, upon the E-Fuse element being disconnected/uncoupled, a fuse data output signal FO with an erroneous L level may be output when the fuse data output signal FO with a correct H level is output. In the above case, although the logic circuits peripheral to the respective 1-bit E-Fuses operate, a clock delay or a non-operation of an SRAM may occur in an entire semiconductor device. As a result, the low voltage may result in a non-operation of the entire semiconductor device.

In consequence, the entire semiconductor device does not operate correctly in a condition where the fuse data output signal FO with the erroneous logic level is output. However, in the second embodiment shown in FIG. 4, an inversion of logic levels of the fuse data output signal FO of the E-Fuse 10 in the first memory unit 20 may result in a loss of an advantage that prohibits the write operation. That is to say, this may cause a problem in terms of prevention of an unauthorized write operation by an unauthorized person.

The first memory unit 20 includes the 1-bit E-Fuses 10 and 10-2, in the modified example in FIG. 5 according to the second embodiment.

Respective E-Fuse elements in the 1-bit E-Fuse 10 and in the 1-bit E-Fuses 10-2 are disconnected/uncoupled so as to prohibit the write operation to the second memory unit 21. In consequence, even if the fuse data output signal FO of the erroneous L level is output when the fuse data output signal FO of the correct H level is output, the OR signal of the OR gate 58 goes to an H level. The second signal Cont2 goes to the L level by the inverter 55. The AND signal of the AND gate 60 is fixed at the L level.

Thus, the output signal EN of the determination unit 6 may prohibit the write operation to the second memory unit 21. Since the 1-bit E-Fuse 10 and the 1-bit E-Fuse 10-2 have the same circuit configuration, correct and erroneous read operations are caused in the same manner, in respective read circuits. Consequently, the following operation does not occur. That is, the erroneous read operation is performed on the 1-bit E-Fuse 10 to cause the fuse data output signal FO to go to the erroneous L level, and the correct read operation is performed on the 1-bit E-Fuse 10-2 to cause the fuse data output signal FO to go to the correct H level.

In the modified example in FIG. 5 according to the second embodiment, the write operation to the second memory unit 21 is prohibited if the fuse data output signal FO of the 1-bit E-Fuse 10 is the H level. The write operation to the second memory unit 21 is prohibited if the fuse data output signal FO of the 1-bit E-Fuse 10-2 is the L level. Owing to the above operations, even if the fuse data output signal FO with the erroneous logic level is output in the low voltage condition where the power supply voltage does not satisfy the predetermined operation condition, the advantage prohibiting the write operation to the second memory unit 21 may be achieved. Thus, unauthorized write operation by unauthorized persons may be prevented even in the low voltage condition.

Figure 6:
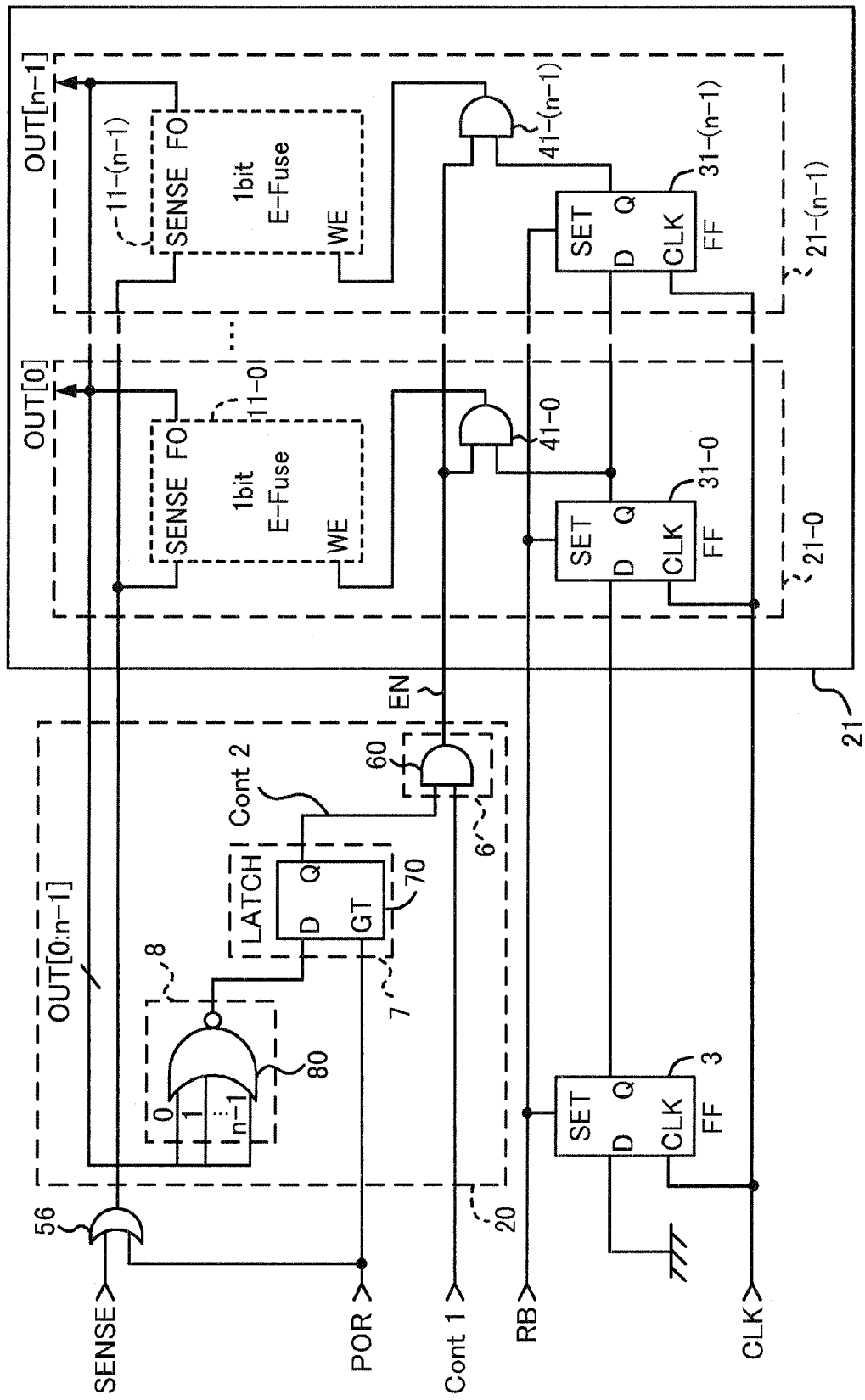
FIG. 6 illustrates aspects of a third embodiment.

FIG. 6 illustrates a third embodiment. A first memory unit 20 includes a determination unit 6, a holding unit 7 and a calculation unit 8.

As shown in FIG. 6, the determination unit 6 includes an AND gate 60. An output signal EN of the determination unit 6 is an AND signal output from the AND gate 60, in the third embodiment. A first signal Cont1 and a second signal Cont2, output from the holding unit 7, is input to the AND gate 60. The holding unit 7 includes a latch 70. In the third embodiment, the second signal Cont2 is an output (Q) of the latch 70. The second signal Cont2 is held by the latch 70 at a voltage level, which is logically determined by a logic circuit. A data terminal (D) of the latch 70 is coupled to an output of the calculation unit 8. A power-on reset signal POR is input to a GT terminal of the latch 70. The calculation unit 8 includes a NOR gate 80. In the third embodiment, the output of the calculation unit 8 is a NOR signal output from the NOR gate 80. Fuse data output signals FO of 1-bit E-Fuses 11-0 to 11-(n−1) are input to the NOR gate 80. The fuse data output signals FO are output signals OUT [0] to OUT [n−1] of bit information memory units 21-0 to 21-(n−1) provided in a second memory unit 21.

As further shown in FIG. 6, an FF 3 and the second memory unit 21 are the same as those of the first embodiment in FIG. 3 and the descriptions thereof will be reduced or omitted. An OR gate 56 is the same as the OR gate 51 of the first embodiment in FIG. 3 and the description thereof will be reduced or omitted.

An operation of the third embodiment in FIG. 6 will be disclosed.

Operations of the FF 3 and FF 31-0 to 31-(n−1) are the same as those of the first embodiment in FIG. 3 and the descriptions thereof will be reduced or omitted.

In the first embodiment in FIG. 3 and/or the second embodiment in FIG. 4, the first memory unit 20 includes a 1-bit E-Fuse 10. A state of a write operation performed on the 1-bit E-Fuse 10 provided in the first memory unit 20 is indicated with the second signal Cont2, indicating whether or not the write operation is finished. In the third embodiment in FIG. 6, a state of a write operation performed on any of the 1-bit E-Fuses 11-0 to 11-(n−1) provided in the second memory unit 21 is indicated with the second signal Cont2, indicating whether or not the write operation is finished.

As further shown in FIG. 6, upon turning ON power, the power-on reset signal POR rises. A read control signal SENSE input via the OR gate 56 to the 1-bit E-Fuses 11-0 to 11-(n−1) goes to an H level. The 1-bit E-Fuses 11-0 to 11-(n−1) goes to a read mode. Data is read from E-Fuse elements of the 1-bit E-Fuses 11-0 to 11-(n−1) and the output signals OUT [0] to OUT [n−1], which are the fuse data output signals FO thereof, are output. The output signals OUT [0] to OUT [n−1] are input to the NOR gate 80. The latch 70 holds a logic of the NOR signal of the NOR gate 80 in response to the rise in the power-on reset signal POR. The second signal Cont2, holding a logic level thereof, is output from the latch 70.

As further shown in FIG. 6, before all the E-Fuse elements of the 1-bit E-Fuses 11-0 to 11-(n−1) in the second memory unit 21 are disconnected/uncoupled the fuse data output signals FO thereof are an L level. All the output signals OUT [0] to OUT [n−1] input to the NOR gate 80 are an L level. In consequence, the NOR signal of the NOR gate 80 is an H level. The second signal Cont2 is held at an H level and output, by the latch 70. Thus the AND signal output from the AND gate 60 becomes a signal having the same phase as that of the first signal Cont1.

As further shown in FIG. 6, the fuse data output signal FO output from the 1-bit E-Fuse that includes a disconnected/uncoupled E-Fuse element goes to an H level if at least any one of the E-Fuse elements of the 1-bit E-Fuses 11-0 to 11-(n−1) in the second memory unit 21 is disconnected/uncoupled. Some of the output signals OUT [0] to OUT [n−1] input to the NOR gate 80 may go to an H level. In consequence, the NOR signal output from the NOR gate 80 is an L level. The second signal Cont2 is held at an L level and output, by the latch 70. In consequence, since the first signal Cont1 is masked, the AND signal output from the AND gate 60 is fixed at an L level.

As further shown in FIG. 6, the write operation to the second memory unit 21 is permitted with the first signal Cont1 if none of the E-Fuse elements of the 1-bit E-Fuses 11-0 to 11-(n−1) provided in the second memory unit 21 is disconnected/uncoupled. On the other hand, the first signal Cont1 is masked and the AND signal output from the AND gate 60 is fixed at the L level if at least any one of the E-Fuse elements of the 1-bit E-Fuses 11-0 to 11-(n−1) in the second memory unit 21 is disconnected/uncoupled. Hence, the write operation to the second memory unit 21 is prohibited based upon the output signal EN output from the determination unit 6. With use of the second signal Cont2, it is indicated whether or not any of the E-Fuse elements of the 1-bit F-Fuses 11-0 to 11-(n−1) in the second memory unit 21 is disconnected/uncoupled.

In other words, the state of the write operation performed on any of the 1-bit E-Fuses 11-0 to 11-(n−1) in the second memory unit 21 is indicated with use of the second signal Cont2, indicating whether or not the write operation is finished, in the third embodiment.

Subsequent write operations to the second memory unit 21 may be prohibited with the output signal EN, output from the determination unit 6, by writing a piece of information to any of the 1-bit E-Fuses 11-0 to 11-(n−1) in the first memory unit 21.

As further shown in FIG. 6, in the third embodiment, upon turning ON the power, the data is read from the E-Fuse elements of the 1-bit E-Fuses 10-0 to 11(n−1), with the power-on reset signal POR. In consequence, an unauthorized write operation by an unauthorized person is prevented if the information has been written to the 1-bit E-Fuses 11-0 to 11-(n−1) provided in the second memory unit 21. Note that if each of the 1-bit E-Fuses is in a write mode, the any of the E-Fuse elements provided in the 1-bit E-Fuses 11-0 to 11-(n−1) is disconnected/uncoupled. That is to say, if the read control signal SENSE input to each of the 1-bit E-Fuses is an L level, the any of the E- Fuse elements of the 1-bit E-Fuses 11-0 to 11-(n−1) is disconnected/uncoupled.

In the above case, respective fuse data output signals FO go to the H level even if the write operation has not yet been performed on all the 1-bit E-Fuses 11-0 to 11-(n−1) in the second memory unit 21 (see FIG. 2). The above operation may cause a presumption that the write operation thereto is prohibited. However, since the second signal Cont2 at the time of power-on is held by the latch 70, the write operation to the second memory unit 21 is not prohibited with the output signal EN output from the determination unit 6, during the pre-write operation. The disconnection/uncoupling of any of the E-Fuse elements of the 1 bit E-Fuses 11-0 to 11-(n−1) may be possible at least until the power is turned off.

According to the embodiments disclosed above, the first signal Cont1 may be, for example, a first signal that permits a write operation to a first memory unit or a second memory unit. The second signal Count2 may be, for example, a second signal that indicates whether or not predetermined information or first information has been written to the first memory unit. The output signal EN of the determination unit 6 may be, for example, a signal that prohibits the write operation to the second memory unit. The E-Fuse elements of 1-bit E-Fuses 10 and 10-2 provided in the first memory unit 20 may be, for example, a first fuse. The E-Fuse elements of 1-bit E-Fuses 11-0 to 11-(n−1) provided in the second memory unit 20 may be, for example, a second fuse. The latch 70 may be, for example, a holding unit. The NOR gate 80 may be, for example, a calculation unit. The state of the write operation performed on the 1-bit E-Fuse 10 and the state of the write operation performed on any of the 1-bit E-Fuses 11-0 to 11-(n−1) may be, for example, the predetermined information or the first information. The output signals OUT [0] to OUT [n−1] may be, for example, a signal that has read the piece of information written to the second memory unit or second information.

According to the first embodiment, upon turning of the power, the data of the E-Fuse element of the 1-bit E-Fuse 10 is read with the power-on reset signal. With the second signal Cont2, it is indicated whether the E-Fuse element of the 1-bit E-Fuse 10 is disconnected/uncoupled or not. Consequently, if the information has been written to the 1-bit E-Fuse 10 provided in the first memory unit 20, the write operation to the second memory unit 21 is prohibited, with high reliability, with use of the output signal EN of the determination unit 6.

According to the second embodiment, the write-protect read control signal SENSEWP and the read control signal SENSE are combined.

To perform the write operation on the second memory unit 21, the data of the E-Fuse element of the 1-bit E-Fuse 10 in the first memory unit 20 is read. With the second signal Cont2, it is indicated whether the E-Fuse element of the 1-bit E-Fuse 10 is disconnected/uncoupled or not. As a result, if the piece of information has been written to the 1-bit E-Fuse 10 provided in the first memory unit 20, the write operation to the second memory unit 21 is prohibited with the output signal EN output from the determination unit 6. Power consumption may be reduced by not switching the 1-bit E-Fuse 10 provided in the first memory unit 20 to the read mode, except for a period in which the write operation is performed on the second memory unit. Since the first memory unit 20 includes the 1-bit E-Fuse 10-2 in addition to the 1-bit E-Fuse 10, the write operation to the second memory unit 21 is prohibited even when the fuse data output signal FO with the erroneous logic level is output in the low voltage when the power supply voltage does not satisfy the predetermined operating condition.

According to the third embodiment, upon turning ON the power, the data of the E-Fuse elements of the 1-bit E-Fuses 11-0 to 11-(n−1) is read with the power-on reset signal POR. With the second signal Cont2, it is indicated whether any of the E-Fuse elements of the 1-bit E-Fuses 11-0 to 11-(n−1) are disconnected/uncoupled or not. Consequently, if the piece of information has been written to any of the 1-bit E-Fuses 11-0 to 11-(n−1) in the second memory unit 21, the write operation to the second memory unit 21 is prohibited with the output signal EN output from the determination unit 6.

According to the embodiments disclosed above, if the predetermined information has been written, the write operation to the second memory unit 21 is prohibited. As a result thereof, the write operation to the second memory unit 21 may be prohibited, for example, without use of an operation (such as, the first signal Cont1) from an outside of the semiconductor device, so that the unauthorized write operation by the unauthorized person is prevented. Consequently, tamper-proof capability is improved.

Note that the present invention is not limited to the embodiments disclosed above. It is needless to say that various modifications and structural changes may be possible without departing from the scope of the present invention. For example, the operation of writing the piece of information to the first memory unit 20 and the second memory unit 21 is disclosed as the write operation based upon the disconnection/uncoupling or the connection/coupling of the E-Fuse elements of the respective 1-bit E-Fuses. However, the present invention is not limited thereto. In terms of the data of the E-Fuse element, the data before the disconnection/uncoupling is defined as the L level and the data after the disconnection/uncoupling is defined as the H level in the embodiments disclosed above and vice versa may be possible. In terms of the function of the 1-bit E-Fuse illustrated in FIG. 2, the present invention is not limited thereto The determination unit 6 includes the AND gate 60, the holding unit 7 includes the latch 70 and the calculation unit 8 includes the NOR gate 80, respectively. However, the present invention is not limited thereto. In the first embodiment in FIG. 3 and the second embodiment in FIG. 4, the first memory unit 20 includes only a single 1-bit E-Fuse 10. In terms of the 1-bit E-Fuse 10, the first memory unit 20 may include a plurality of 1-bit E-Fuses. For example, if the first memory unit 20 includes the N number of 1-bit E-Fuses, one of 1-bit E-Fuses may correspond to one write operation performed on the second memory unit 21. The write operation to the second memory unit 21 may be prohibited by the write operations performed on all of the N number of the 1-bit E-Fuses. The prohibition of the write operation to the second memory unit 21 is controlled in response to the number of times of the write operations.

The prohibition of the write operation may be controlled in units of portions by dividing the second memory unit 21 into several portions, in the embodiments disclosed above. In the first and the second embodiments, the write operation performed on the second memory unit 21 is triggered with the operation of writing the piece of information to the 1-bit E-Fuse 10 in the first memory unit 20.

In the third embodiment, the operation of writing the information to the second memory unit 21 is triggered with the write operation performed on the 1-bit E-Fuses 11-0 to 11-(n−1) in the second memory unit 21. The above operation may be combined with those of the rest of the embodiments. For example, the prohibition of the write operation performed on the second memory unit 21 may be controlled based upon two conditions, such as, the state of the write operation of each of the bit information memory units 21-0 to 21-(n−1) provided in the second memory unit 21 and the number of write operations performed on the entire second memory unit 21.

In the embodiments disclosed above, since the write signal WE, input to the 1-bit E-Fuses 11-0 to 11-(n−1) of the second memory unit 21, does not go to the H level, none of the E-Fuse elements in the second memory unit 21 is disconnected/uncoupled. The write operation to the second memory unit 21 is prohibited by the above operation. However, the present invention is not limited to the structures disclosed above. For example, the prohibition of the write operation performed on the second memory unit 21 may be triggered based upon the reset signal that does not go to the L level. If the reset signal RB does not go to the L level, that is to say, if the reset signal RB is held at the H level, the FF remains initialized. This is because the operation that causes the H level of the output (Q) of the FF to transfer to the subsequent FFs, on the clock-by-clock basis, is not obtained.

Alternatively, the memory units of the embodiments may be provided on commonly-used electronic devices, such as, personal computers, mobile phones, digital cameras, gaming devices and so on. Various types of information, such as, serial numbers, operating information of electronic devices, is stored the memory units of the embodiments, the various types of information is read, and thereby the electronic devices operating based upon the various types of information that has been read out. Since the memory units of various embodiments are equipped with the tamper-proof capability, a possibility of alteration of the various types of information may be suppressed, so that the electronic devices may operate in a normal state.

According to the embodiments disclosed above, the signal that prohibits the write operation is output if the predetermined information or the first information has already been written. As a result thereof, the unauthorized write operation by the unauthorized person may be prevented, and the tamper-proof capability may be improved.

Although a few embodiments have been shown and described, it would be appreciated by those skilled in the art that changes might be made in these embodiments without departing from the principles and spirit of the invention, the scope of which is defined in the claims and their equivalents. Numbers applying embodiments (first, second or third etc.) do not show priorities of the embodiments. Many variations and modifications will be apparent to those skilled in the art.

What is claimed is:

1. A semiconductor device comprising:
a first memory unit;
a second memory unit; and
a determination unit receiving a first signal permitting a write operation to one of the first memory unit and the second memory unit, and a second signal indicating whether the write operation of information to the first memory unit is finished;
wherein the determination unit outputs a signal prohibiting a write operation to the second memory unit, if the second signal indicates the write operation of the information is finished.

2. The semiconductor device according to claim 1, wherein the first memory unit and the second memory unit permit the write operation of the information once.

3. The semiconductor device according to claim 2,
wherein the first memory unit comprises a first fuse and the second memory unit comprises a second fuse, and
wherein the information is written to the first memory unit and the second memory unit, based upon one of uncoupling and coupling of one of the first fuse and the second fuse.

4. The semiconductor device according to claim 2,
wherein the second signal is a signal which allows the determination unit to output a signal prohibiting the write operation to the second memory unit, when a power supply voltage fails to satisfy a predetermined operating condition.

5. The semiconductor device according to claim 4,
wherein the first memory unit comprises a plurality of first fuses, and
wherein the second signal outputs the signal prohibiting the write operation to the second memory unit.

6. The semiconductor device according to claim 1 further comprising:
a holding unit holding the second signal at a logically determinable voltage level, in response to an initialization operation upon turning on power.

7. The method according to claim 1,
wherein the first memory unit comprises a calculation unit to which the second signal is input.

8. The method according to claim 1,
wherein the determination unit masks the first signal if the second signal indicates the write operation of the information is finished.

9. An information control method comprising:
inputting a first signal, the first signal permitting a write operation to one of a first memory unit and a second memory unit, and inputting a second signal, the second signal indicating whether the write operation of information to the first memory unit is finished;
outputting a signal prohibiting the write operation to the second memory unit, if the second signal indicates the write operation of the information to the first memory unit is finished.

10. An electric device comprising:
a first memory unit adapted to first information;
a second memory unit adapted to second information;
a circuit operating in response to second information stored in the second memory unit; and
a determination unit receiving a first signal permitting a write operation to one of the first memory unit and the second memory unit, and a second signal indicating whether the write operation of first information to the first memory unit is finished;
wherein the determination unit outputs a signal prohibiting the write operation to the second memory unit, if the second signal indicates the write operation of the first information is finished.

* * * * *